(12) United States Patent
Yu et al.

(10) Patent No.: US 12,136,688 B2
(45) Date of Patent: Nov. 5, 2024

(54) LIGHT CONVERSION DEVICE AND PREPARATION METHOD THEREOF, AND DISPLAY DEVICE HAVING LIGHT CONVERSION DEVICE

(71) Applicant: Najing Technology Corporation Limited, Zhejiang (CN)

(72) Inventors: Shirong Yu, Zhejiang (CN); Yongyin Kang, Zhejiang (CN); Jianhai Zhou, Zhejiang (CN)

(73) Assignee: Najing Technology Corporation Limited, Zhejiang (CN)

( * ) Notice: Subject to any disclaimer, the term of this patent is extended or adjusted under 35 U.S.C. 154(b) by 434 days.

(21) Appl. No.: 17/763,666

(22) PCT Filed: Sep. 23, 2020

(86) PCT No.: PCT/CN2020/117237
§ 371 (c)(1),
(2) Date: Mar. 25, 2022

(87) PCT Pub. No.: WO2021/057814
PCT Pub. Date: Apr. 1, 2021

(65) Prior Publication Data
US 2022/0344551 A1  Oct. 27, 2022

(30) Foreign Application Priority Data

Sep. 25, 2019  (CN) .......................... 201910913941.7

(51) Int. Cl.
*H01L 33/50* (2010.01)
*H01L 33/00* (2010.01)

(52) U.S. Cl.
CPC .......... *H01L 33/505* (2013.01); *H01L 33/005* (2013.01); *H01L 2933/0041* (2013.01)

(58) Field of Classification Search
None
See application file for complete search history.

(56) References Cited

U.S. PATENT DOCUMENTS

| 10,698,251 | B2 | 6/2020 | Chu et al. | |
| 2017/0235223 | A1* | 8/2017 | Liang | ..................... G02B 5/201 |
| | | | | 430/7 |

FOREIGN PATENT DOCUMENTS

| CN | 105116685 A | 12/2015 |
| CN | 105242442 A | 1/2016 |
| CN | 105355726 A | 2/2016 |
| CN | 106133935 A | 11/2016 |
| CN | 106526947 A | 3/2017 |
| CN | 110021651 A | 7/2019 |
| CN | 110620134 A | 12/2019 |

* cited by examiner

*Primary Examiner* — Robert K Carpenter
(74) *Attorney, Agent, or Firm* — Samson G. Yu

(57) ABSTRACT

Disclosed are a light conversion device and a preparation method thereof, and a display device having the light conversion device. The preparation method includes the step of performing photolithography process n times on the substrate layer sequentially, wherein a patterned quantum dot structure and a cured photoresist layer are obtained by means of this step.

17 Claims, 6 Drawing Sheets

LIGHT CONVERSION DEVICE AND PREPARATION METHOD THEREOF, AND DISPLAY DEVICE HAVING LIGHT CONVERSION DEVICE

CROSS REFERENCE TO RELATED APPLICATIONS

This application is a national application of PCT/CN2020/117237, filed on Sep. 23, 2020. The contents of PCT/CN2020/117237 are all hereby incorporated by reference.

TECHNICAL FIELD

The present disclosure relates to the field of optics, and in particular, to a light conversion device, a preparation method thereof, and a display device having the light conversion device.

BACKGROUND

Currently, there are typically two preparation methods of light conversion device: First, the quantum dot photoresist resin is prepared and coated on a substrate, and then the resin layer is patterned according to conventional photolithography process, to obtain light conversion device.

Second, by surface modification of a non-quantum dot layer to achieve a specific functionalization, the quantum dot resin can automatically fill in the desired sub-pixel regions from the non-quantum dot layer after coating the quantum dot resin.

However, there are sane problems in the above two methods:

In the first scheme, the chemical environment in which quantum dots are located is highly required in the preparation of quantum dot photoresist resin, as the resin contains a lot of photoinitiators which can quench luminescence of the quantum dots obviously. In addition, propylene glycol methyl ether acetate (PGMEA), an existing mature solvent system for photoresist resin, is incompatible with quantum dots, and the low solubility of quantum dots resulting in their nonuniform dispersion in the quantum dot photoresist, affecting the implementation of the subsequent photolithography process. The above problems lead to low light conversion efficiency of the light conversion device obtained by the preparation method.

In the second scheme, although harsh chemical modification of quantum dots is not required to meet requirement of photoresist resin, the feasibility of patterning quantum dots by surface chemical modification of other layers (non-quantum dot layer) is only theoretically possible, and the specific functionalization of the entire surface of other layers cannot be realized in practical production. Even if the specific functionalization of the entire surface of other layers can be achieved through rigorous process, in practice a small amount of quantum dot resin will remain in the non-target area, resulting in poor display.

SUMMARY

The primary object of the present disclosure is to provide a light conversion device, a preparation method thereof, and a display device having the light conversion device.

According to one aspect of the present disclosure, there is provided a preparation method of a light conversion device, including:

S1, a plurality of pixel isolation structures are disposed on a first surface of a substrate layer, and a plurality of sub-pixel regions isolated from each other are formed between the pixel isolation structures;

S2, a photolithography process is performed n times on the substrate layer sequentially, wherein each of the photolithography processes includes a quantum dot adhesive layer and a photoresist layer are formed on the substrate layer in sequence, the photoresist layer is located on the quantum dot adhesive layer far away front substrate layer, and a part of the quantum dot adhesive layer fills in the sub-pixel regions which are bare; the photoresist layer is exposed and developed, and at least one sub-pixel region is exposed; in each of the photolithography processes, a rumba of bare sub-pixel regions after a mth time photolithography process is larger than a number of bare sub-pixel regions after (m+1)th time photolithography process, the bare sub-pixel regions after the mth time photolithography process is filled with a part of a quantum dot adhesive layer formed in the (m+1)th time photolithography process, and orthographic projections of patterned quantum dot structures obtained in each of the photolithography processes is not overlapped in the sub-pixel regions; curing the quantum dot adhesive layers which are remaining and the photoresist layers which are remaining which is remaining to obtain the patterned quantum dot structures and cured photoresist layers, wherein $n > m \geq 1$, and n and m are all positive integers.

According to another aspect of the present disclosure, there is provided a light conversion device, includes a substrate layer and a plurality of pixel isolation structures disposed on a first surface of the substrate layer, the plurality of pixel isolation structures are opaque, and a plurality of sub-pixel regions isolated from each other are formed between the plurality of pixel isolation structures, wherein, the light conversion device further includes:

a plurality of patterned quantum dot structures, disposed on a surface of the substrate layer with the pixel isolation structures, for emitting light with multiple colors under excitation of a light source, wherein, each of the patterned quantum dot structures consists of a light conversion structure and a non-light conversion structure, the light conversion structure is disposed in at least are of the plurality of sub-pixel regions, and orthographic projections of the different types of non light conversion structures corresponding to the different types of patterned quantum dot structures on the pixel isolation structures are at least partially overlapped;

cured photoresist layers, covering a surface of each of the patterned quantum dot structures away from the substrate layer, the cured photoresist layers are disposed on a surface of the light conversion structure in different patterned quantum dot structures, and the cured photoresist layers are disposed between the different types of non-light conversion structures corresponding to the different patterned quantum dot structures.

According to another aspect of the present disclosure, there is also provided a display device including a light conversion device, wherein the light conversion device is prepared by the aforesaid preparation method, or the light conversion device is the aforesaid light conversion device.

BRIEF DESCRIPTION OF THE DRAWINGS

The drawings constituting a part of the present disclosure are used to provide a further understanding of the present disclosure, and the schematic embodiment of the present disclosure and the description thereof are for explaining the present disclosure, and does not constitute an improper limitations of the present disclosure. In the drawings.

Figure 1:
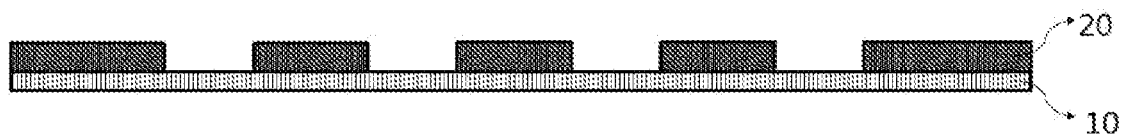
FIG. 1 shows a sectional view of the workpiece after forming a plurality of pixel isolation structures on a first surface of the substrate layer in a preparation of a light conversion device according to the present disclosure embodiment.

Wherein, the substrate in the description of FIGS. 1 to 21 refers to various intermediate structures in the preparation process of the light conversion devices.

The above drawings include the following reference signs:
10, substrate layer; 12, first mask plate; 13, second mask plate; 20, pixel isolation structure; 30, patterned quantum dot structure; 310, first quantum dot adhesive layer; 320, second quantum dot adhesive layer; 40, cured photoresist layer, 410, first photoresist layer; 420, second photoresist layer; 50, first planarization layer, 60, second planarization layer.

DETAILED DESCRIPTION

It should be noted that the embodiments of the present disclosure and the features of the embodiments may be combined with each other in case of no conflict. The disclosure will be described in detail below with reference to the figures and in conjunction with the embodiments.

As used herein, the singular forms "a," "an" and "the" are intended to include the plural forms as well, unless the context clearly indicates otherwise.

It should be understood that when an element (such as a layer, a film, a region, or a substrate) is described as being "on" another element, the element can be directly on the other element, or intervening elements may also be present.

In order to enable a person skilled in the art to have a better understanding of the solution of the present disclosure, the technical solutions in the embodiments of the present disclosure will be clearly and completely described below with reference to the figures, but obviously, the described embodiments are merely a part of the embodiments of the invention rather than all of the embodiments. All other embodiments obtained by a person of ordinary skill in the art based on the embodiments of the present disclosure without creative effects should fall within the scope of the present disclosure.

It should be noted that the terms "first", "second", and the like in the specification and claims of the present disclosure are used to distinguish similar objects, and are not necessarily used to describe a particular order or sequence. It should be understood that the number so used may be interchangeable when appropriate to facilitate the description of embodiments of the invention disclosed herein. Furthermore, the terms "include" and "have", as well as any variants thereof, are intended to cover a non-exclusive inclusion, for example, processes, methods, systems, products, or devices that include a series of steps or units are not necessarily limited to include those steps or units explicitly listed, and may include other steps or units not explicitly listed or inherent to such processes, methods, products or devices.

As introduced in the background, the light conversion efficiency of the light conversion devices in the prior art is low. The inventors of the present disclosure conduct research on the above problems, and propose a preparation method of a light conversion device, as shown in FIG. 1-21, including the following steps:

S1, a plurality of pixel isolation structures 20 are disposed on a first surface of a substrate layer 10, and a plurality of sub-pixel regions isolated from each other are formed between the pixel isolation structures 20;

S2, a photolithography process is performed n times on the substrate layer 10 sequentially, wherein each of the photolithography processes includes:

a quantum dot adhesive layer and a photoresist layer are formed on the substrate layer 10 in sequence, the photoresist layer is located on the quantum dot adhesive layer far away from substrate layer 10, and a part of the quantum dot adhesive layer fills in bare sub-pixel regions;

the photoresist layer is exposed and developed so as to expose at least one sub-pixel region;

in each of the photolithography processes, a number of the bare sub-pixel regions after a mth time photolithography process is larger than a number of bare sub-pixel regions after (m+1)th time photolithography process, the bare sub-pixel regions after the mth time photolithography process is filled with a part of a quantum dot adhesive layer formed in the (m+1)th time photolithography process, and orthographic projections of patterned quantum dot structures 30 obtained in each of the photolithography processes being not overlapped in the sub-pixel regions, and curing the quantum dot adhesive layers which are remaining and the photoresist layers which are remaining to obtain the patterned quantum dot structures 30 and cured photoresist layers 40, wherein n>m≥1, and n and m are all positive integers. It should be noted that the part of the photoresist layer is dissolved by the developer to form a gap by exposing and developing the photoresist layer, and the quantum dot adhesive layer in the corresponding region below the gap of the photoresist layer can be removed.

In the preparation process of the light conversion device, the cured photoresist layer can protect the patterned quantum dot structure, which allows the patterned quantum dot structure to have a high concentration of the quantum dots, so that the light conversion efficiency of the light conversion device can be improved.

Compared to the quantum dot photoresist used in the prior art, the present disclosure can obtain the above patterned quantum dot structure by using an ordinary quantum dot adhesive, so that the high blue light absorption rate of the light conversion devices can be achieved by the high concentration of quantum dot adhesive, and the costs can be reduced. The above ordinary quantum dot adhesive refers to the existing low-barrier property and thermal curable quantum dot adhesive, for example, the quantum dot adhesive includes quantum dots, acrylic resin, epoxy resin, thermal initiator, auxiliary and so on. Of course it is also possible to obtain the above patterned quantum dot structure by using a high-barrier property and thermal curable quantum dot adhesive.

In some embodiments, the concentration of the quantum dots in the material forming the quantum dot adhesive layer is 5 wt % to 50 wt %. In some embodiments, the concentration of the quantum dots in the material forming the quantum dot adhesive layer is 10 wt % to 30 wt %.

Unlike the process of using the quantum dot photoresist inducting the photoinitiator in the prior art, the quantum dot adhesive in the sub-pixel region in the process of the present disclosure may be free of light exposure, thereby without the quenching canned by the photoinitiator. Even if the quantum dot adhesive in the sub-pixel region is exposed, the problem of fluorescence quenching of quantum dots caused by the photoinitiator can be greatly reduced due to the absence of the photoinitiator.

Further, in the development process of the present disclosure, the regions which the developer may be in contact with are the non-target pixel regions (no need to achieve light-emitting), and the cured photoresist layer can protect the quantum dots in the target pixel regions from quenching, effectively ensuring that the obtained light conversion device can have high light conversion efficiency.

In some embodiments, n=2 and m=1; or, n=3 and m=2; or, n=3 and m=1; or, n=4 and m=1; or, n=4 and m=2; or, n=4 and m=3.

In some embodiments, the thickness of the quantum dot adhesive layer is 1 μm to 20 μm, the thickness of the photoresist layer is 1 μm to 10 μm, preferably the thickness of the quantum dot adhesive layer is 5 μm to 10 μm, and the thickness of the photoresist layer is 2 μm to 5 μm.

Exemplary embodiments of the preparation method of the light conversion device according to the present disclosure will be described in more detail below. However, these exemplary embodiments may be implemented in a variety of different forms, and should not be construed as being limited to the embodiments set forth herein. It should be understood that these embodiments are provided to enable the disclosure of this application to be thorough and complete, and that the idea of these exemplary embodiments is fully communicated to an ordinary person skilled in the art.

Firstly, S1 is performed: the plurality of pixel isolation structures 20 are disposed on the first surface of a substrate layer 10, and the plurality of sub-pixel regions isolated from each other are formed between the pixel isolation structures 20.

Those skilled in the art can choose the type of the substrate layer 10 reasonably according to the different application of the light conversion device. For example, when the light conversion device is applied to the LCD, the substrate layer 10 may be a glass substrate, and when the light conversion device is applied to the micro-LED or mini-LED, the substrate layer 10 may be a polymeric film (e.g., a transparent polyimide or the like), and when the light conversion device is applied to the flexible display, the substrate layer 10 may be a flexible substrate.

The pixel isolation structures 20 can be obtained by coating a black photoresist on the surface of the substrate layer 10 and exposing through a mask plate, but is not limited to this preparation process. Those skilled in the art can choose the process for forming the pixel isolation structures 20 reasonably according to the prior art.

The plurality of sub-pixel regions are formed between the pixel isolation structures 20, and the sub-pixel regions are subsequently filled with the quantum dot materials with different light-emitting colors (wavelengths) to meet the demand for multiple light-emitting colors of the light conversion device.

After the step of the pixel isolation structures 20 is formed, S2 is performed: the photolithography process is performed n times on the substrate layer 10 sequentially. In some embodiments, S2 may include the following steps:

S21, a first photolithography process including: a first quantum dot adhesive layer 310 and a first photoresist layer 410 are formed in sequence on the substrate layer 10, with a part of the first quantum dot adhesive 310 filling in each sub-pixel region, and a surface of the first quantum dot adhesive layer 310 is covered with the first photoresist layer 410, the first photoresist layer 410 and the first quantum dot adhesive layer 310 are formed in sequence by using a first mask plate so as to expose at least one sub-pixel region, and at least one sub-pixel region to be filled with a part of the first quantum dot adhesive layer 310, and the first quantum dot adhesive layer 310 which is remaining and the first photoresist layer 410 are cured to form a first patterned quantum dot structure and a first cured photoresist layer, the first patterned quantum dot structure and the first cured photoresist layer form a first photolithography structure;

S22, a second photolithography process includes: a second quantum dot adhesive layer 320 is formed covering the first photolithography structure on the substrate layer 10, and a second photoresist layer 420 is formed covering the second quantum dot adhesive layer 320, with a part of the second quantum dot adhesive layer 320 filling in the bare sub-pixel regions, and a surface of the second quantum dot adhesive layer 320 is covered with the second photoresist layer 420, the second photoresist layer 420 and the second quantum dot adhesive layer 320 are exposed and developed in sequence by using a second mask plate so as to expose at least one sub-pixel region, and at least one sub-pixel region to be filled with a part of the second quantum dot adhesive layer 320, and the second quantum dot adhesive layer 320 which is remaining and the second photoresist layer 420 are cured to form a second patterned quantum dot structure and a second cured photoresist layer, the second patterned quantum dot structure and the second cured photoresist layer form a second photolithography structure.

In some embodiments, the S2 further includes: S23, the photolithography process of the S22 is repeated at least once to form each of the patterned quantum dot structures 30 and each of the cured photoresist layers 40. In the aforesaid embodiment, a UV light source can be used as the LED backlight of the light conversion device.

In some embodiments, in S2, the step of the quantum dot adhesive layer and the photoresist layer are formed on the substrate layer 10 in sequence includes: a quantum dot adhesive and a photoresist are disposed on the substrate layer 10 in sequence, and the quantum dot adhesive and the photoresist are pre-cured to form the quantum dot adhesive layer and the photoresist layer. The above pre-curing can achieve a basic curing effect, which can not ally maintain the shape of the quantum dot adhesive layer and the photoresist layer, but also facilitate the subsequent step in which the specific parts of the quantum dot adhesive layer and the photoresist layer are etched by the developer. The quantum dot adhesive is a material forming the quantum dot adhesive layer, and the photoresist is a material forming the photoresist layer.

In some embodiments, quantum dot materials of the quantum dot adhesive layer (the first quantum dot adhesive layer, the second quantum dot adhesive layer, . . . , the nth quantum dot adhesive layer in the nth time photolithography process) in each of the photolithography processes are the same or different. In sane embodiments, the quantum dot materials are selected from red quantum dots, green quantum dots or blue quantum dots. It should be noted that the quantum dot materials of each of the above luminescent colors may include quantum dot materials with same colors (wavelength regions is close or the same) but the peak emission wavelength being different.

In some embodiments, the quantum dot material can be II-VI compound, IV-VI compound, I-III-VI compound, I-II-IV-VI compound III-V compound, perovskite or carbon quantum dos, etc. The above II-VI compound may further include a Group III metal. The above III-V compound may further include a Group II metal (e.g., InZnP). The above quantum dot materials are core-shell quantum dots or alloy quantum dots or quantum dots having a doped element.

In some embodiments, the photoresist layer (such as the first photoresist layer, the second photoresist layer . . . the nth photoresist layer in the nth time photolithography process) in each of the photolithography processes is formed of the same or different photoresist. In some embodiments, the photoresist layers are formed of a positive photoresist or negative photoresist. Examples of the positive photoresist can be a linear phenolic resin photoresist and so on, but is not limited thereto. Examples of negative photoresist may be an acrylic resin photoresist and so on, but is not limited thereto.

In some embodiments, the quantum dot adhesive layer includes an adhesive and quantum dot materials dispersed in the adhesive. In some implementations, the process of exposing at least one sub-pixel region in the S22 includes: the adhesive being the same as the material forming the photoresist layer, and in the step of exposing and developing the photoresist layer, treating the quantum dot adhesive layer with a developer to remove a part of the quantum dot adhesive layer having a bare surface (that is, the quantum dot adhesive layer in the corresponding region below the gap of the photoresist layer, which is famed by developer).

It should be noted that in the above-described S21, the way of exposing the sub-pixel region is not limited to the preferred embodiment, as in some other implementations, the process of at least one sub-pixel region is exposed includes: the adhesive is different from the material forming the photoresist layer, and after the step of the photoresist layer is exposed and developed, a part of the surface of the quantum dot adhesive layer is exposed, and the quantum dot adhesive layer is etched to remove a part of the quantum dot adhesive layer having a bare surface.

In some embodiments, the step of the photoresist layer is exposed and developed includes: the photoresist layer of a specific region is exposed and developed to remove the photoresist layer of the specific region, the specific region includes a region right above the at least one sub-pixel region, and at least part of a region right above the pixel isolation structure 20 which defines the at least one sub-pixel region, and the at least part of the region right above the pixel isolation structure is a region close to the sub-pixel region in the specific region.

In some embodiments, the step of the photoresist layer is exposed and developed includes: a specific region of the photoresist layer is exposed and developed, to remove the photoresist layer of the specific region, the specific region includes a region right above the at least one sub-pixel region.

Figure 10:
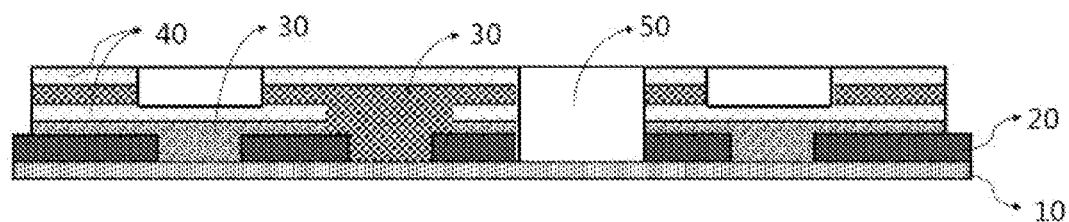
FIG. 10 shows a sectional view of the workpiece after forming first planarization layers on the substrate shown in FIG. 9.
Figure 11:
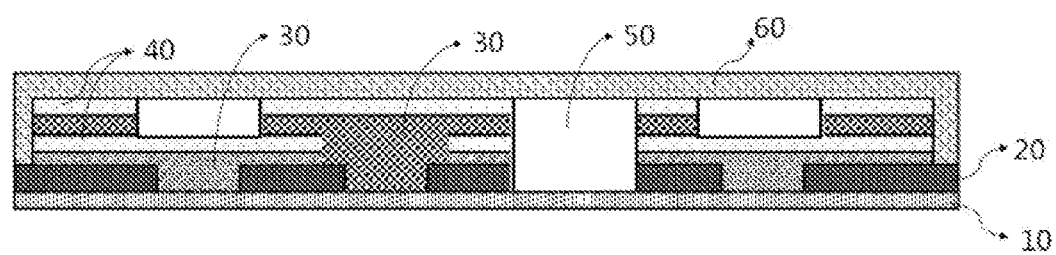
FIG. 11 shows a sectional view of the workpiece after forming a second planarization layer on the first planarization layers shown in FIG. 10.
Figure 21:
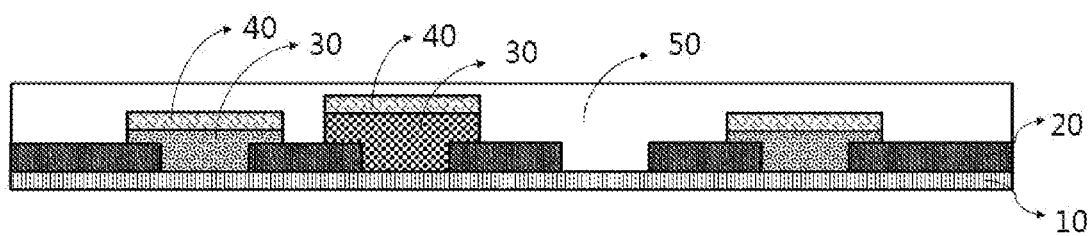
FIG. 21 shows a sectional view of the workpiece after forming a first planarization layer on the substrate shown in FIG. 20.

In some embodiments, after the S2, the preparation method of the present disclosure further includes S3: a planarization layer is famed on the substrate layer 10 to cover the patterned quantum dot structures 30 and the cured photoresist layers 40. In scene embodiments, the step of the planarization layer is formed may include: first planarization layers 50 is formed in the voids between the patterned quantum dot structures 30 and the cured photoresist layers 40, as shown in FIG. 10. In some implementations, a second planarization layer 60 is formed on the surfaces of the patterned quantum dot structures 30, the cured photoresist layers 40, and the first planarization layers 50, as shown in FIG. 11. The first planarization layers 50 and the second planarization layer 60 may be the same material a different materials. In scene embodiments, a first planarization layer 50 that covers the patterned quantum dot structures 30 and the cured photoresist layers 40 can also be prepared by a one-step process, as shown in FIG. 21. The material of the planarization layer may be a material having a high water and oxygen barrier effect, such as a high crosslinked acrylic resin, a polydimethylsiloxane resin, or the like, thereby combining the effect of protecting quantum dots, it can also be common materials. Those skilled in the art can make reasonable selection of the above-mentioned planarization layers according to the prior art, and will not be described herein.

Figure 22:
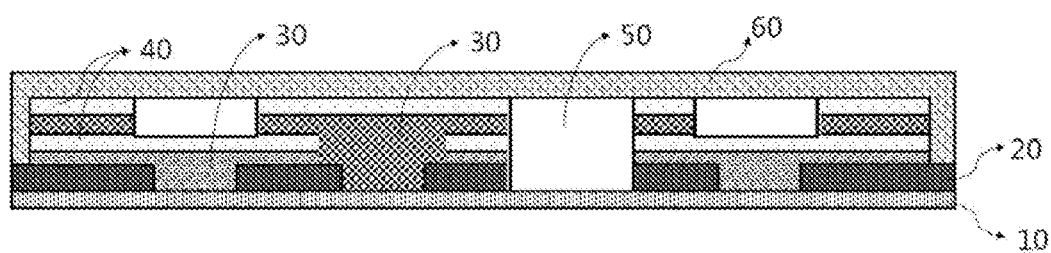
FIG. 22 shags a sectional view of a light conversion device according to the present disclosure embodiment.

According to another aspect of the present disclosure, there is provided a light conversion device, as shown in FIG. 22, includes a substrate layer 10 and a plurality of opaque pixel isolation structures 20 disposed on a first surface of the substrate layer 10 to separate a plurality of sub-pixel regions from each other, wherein, the light conversion device further includes a plurality of patterned quantum dot structures 30 and cured photoresist layers 40.

The plurality of patterned quantum dot structures 30 are disposed on the surface of the substrate layer 10 with the pixel isolation structures 20, for emitting light with multiple colors under excitation of a light source (each of the patterned quantum dot structures 30 can be emitted light of the same or different wavelengths independently under excitation of the light source), wherein, each of the patterned quantum dot structures 30 consists of a light conversion structure and a non-light conversion structure, the light conversion structure is disposed in at least one of the plurality of sub-pixel regions sub-pixel regions, and orthographic projections of the different types of non-light conversion structures corresponding to the different types of patterned quantum dot structures 30 on the pixel isolation structures 20 are at least partially overlapped.

The shape of the patterned quantum dot structure 30 can be designed according to actual needs. The patterned quantum dot structure 30 can be composed of quantum dot adhesive layers. The non-light conversion structure refers to the structure in the patterned quantum dot structure 30 which could not realize the light conversion function, since the quantum dots cannot receive light of the primary light source during the operation of the light conversion device. Further, there is no photoinitiator in the materials of the quantum dot adhesive layer, thereby without the quenching caused by the photoinitiator, and the problem of quenching of quantum dot in the patterned quantum dot structure 30 caused by the photoinitiator can be greatly reduced due to the absence of the photoinitiator.

In some embodiments, the concentration of the quantum dots of the patterned quantum dot structure 30 is 5 wt % to 50 wt %. In some embodiments, the concentration of the quantum dots of the patterned quantum dot structure 30 is 10 wt % to 30 wt %.

Based on the substrate layer 10, the heights of different kinds of the patterned quantum dot structures 30 are different.

The cured photoresist layers 40 cover the surface of each of patterned quantum dot structures 30 away from the substrate layer 10, and the cured photoresist layers 40 are disposed on the surface of the light conversion structure in different patterned quantum dot structures 30 and are disposed between the different types of non-light conversion structures of the different patterned quantum dot structures 30.

In the light conversion device, the cured photoresist layer can protect the patterned quantum dot structure, which allows the patterned quantum dot structure to have a relative high concentration of the quantum dots, so that the light conversion efficiency of the light conversion device can be improved.

In some embodiments, the cured photoresist layers 40 are composed of light transmissive regions and opaque regions, and the light transmissive regions are located on the surface of light conversion regions away from the substrate layer 10, and orthographic projections of the opaque regions on the first surface of substrate layer 10 overlap orthographic projections of the non-light conversion regions on the first surface, that is, the opaque regions refer to regions corresponding to the pixel isolation structures 20 in the direction which is perpendicular to the substrate layer 10, and the light transmissive regions refer to the regions other than the opaque regions of the cured photoresist layers 40. The light conversion regions refer to the sub-pixel regions having the patterned quantum dot structure 30. Since the overlapping part of the projections of the cured photoresist layers 40 on the substrate layer 10 are located in the opaque regions, the light leakage and light mixing of final display will be avoided.

In the aforesaid light conversion device of the present disclosure, in order to satisfy the need for various light-emitting colors, in some embodiments, quantum dot materials in each of the patterned quantum dot structures 30 are selected from red quantum dots, green quantum dots or blue quantum dots. It should be noted that the quantum dot materials of each of the above colors may be quantum dot materials having same color while their peak emission wavelengths being different.

In some embodiments, the cured photoresist layers 40 are formed by curing a positive photoresist or a negative photoresist. Those skilled in the art can select a suitable photoresist species from the prior art based on the positive and negative characteristics of the photoresist Examples of the positive photoresist can be a linear phenolic resin photoresist and so on, but is not limited thereto. Examples of negative photoresist may be an acrylic resin photoresist and so on, but is not limited thereto.

In some embodiments, the light conversion device of the present disclosure further includes a planarization layer, and the planarization layer covers the patterned quantum dot structures 30 and the cured photoresist layers 40. In some embodiments, the planarization layer can be prepared by a one-step process to obtain first planarization layers 50 and a second planarization layer 60 covering the patterned quantum dot structures 30 and the cured photoresist layers 40, or the first planarization layers 50 and the second planarization layer 60 can also be prepared step by step, as shown in FIG. 22. The second planarization layer can coat the side of the thickness direction of the light conversion device to achieve a planarization of the side of the light conversion device.

In some embodiments, the material of the planarization layer can be a material that has high water and oxygen barrier properties to realize the protection of the light conversion device.

According to another aspect of the present disclosure, there is provided a display device including a light conversion device prepared by the above-described preparation method, or the aforesaid light conversion device. The display device may be a display device of LCD, OLED, QLED, mini-LED, micro-LED, and the like. The light conversion device is used in conjunction with various LED light sources to achieve colorization, which is applied to the display device.

Next, the light conversion device, the preparation method thereof, and the display device having the light conversion device according to the present disclosure are further described below.

Example 1

A preparation method of a light conversion device provided in this embodiment was shown in FIGS. 1-11, including the following steps:

A plurality of pixel isolation structures 20 were formed on the first surface of the substrate layer 10, and a plurality of sub-pixel regions isolated from each other were formed between the pixel isolation structures 20, as shown in FIG. 1.

Materials of the first quantum dot adhesive layer 310 were prepared, including: 30% by mass of CdSe quantum dots, 40% by mass of acrylic resin monomer, 20% by mass of epoxy resin monomer, 2% by mass of thermal initiator and 8% by mass of the auxiliary agent, stirred to mix evenly as standby.

Figure 2:
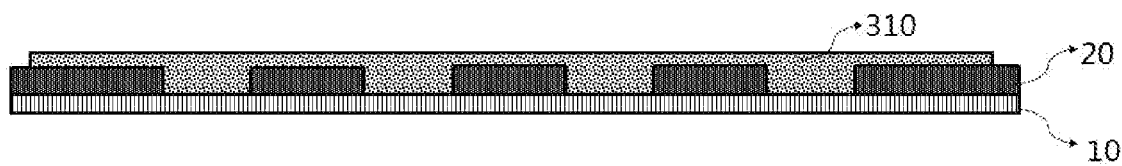
FIG. 2 shows a sectional view of the workpiece after forming a first quantum dot adhesive layer on the substrate layer shown in FIG. 1.
Figure 3:
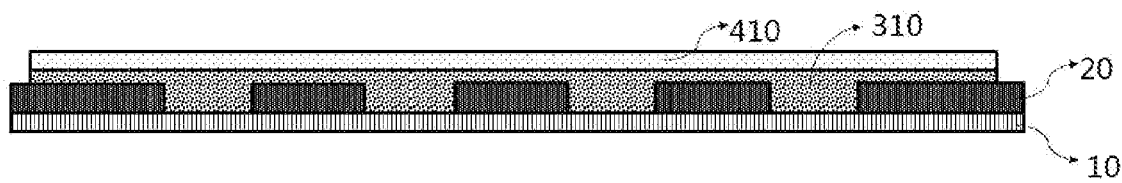
FIG. 3 shows a sectional view of the workpiece after forming a first photoresist layer on the first quantum dot adhesive layer shown in FIG. 2.

The materials of the first quantum dot adhesive layer 310 were provided on the substrate layer 10 to forma first quantum dot layer 310 having a thickness of about 5 μm, so that a part of the first quantum dot adhesive layer 310 filled in each sub-pixel region. A first photoresist layer 410 of about 2 μm thickness was formed on the surface of the first quantum dot adhesive layer 310 by a positive photoresist (linear phenolic resin photoresist), as shown in FIGS. 2 and 3.

Figure 4:
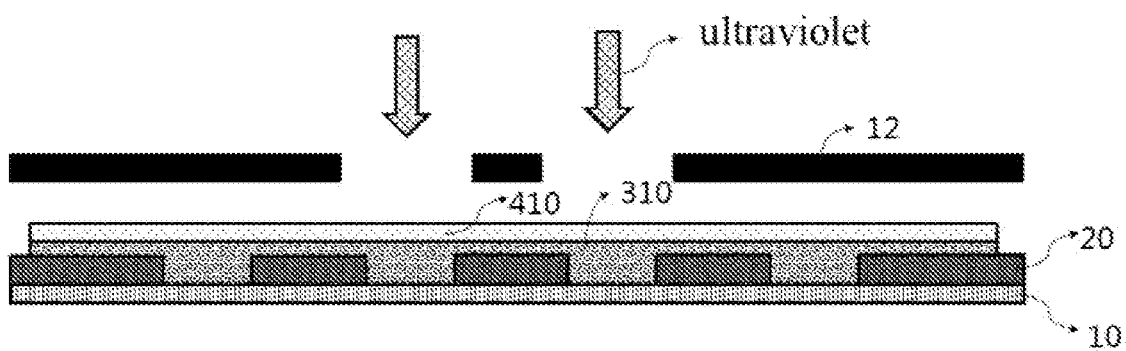
FIG. 4 shows a sectional view of the workpiece after exposing the first photoresist layer and the first quantum dot adhesive layer by using a first mask plate.
Figure 5:
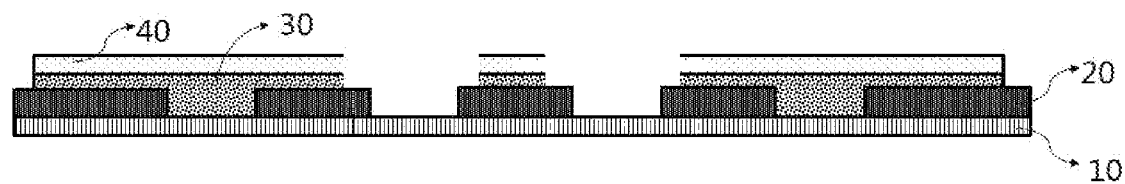
FIG. 5 shows a sectional view of the workpiece after developing the first photoresist layer and the first quantum dot adhesive layer shown in FIG. 4 and curing the remaining first quantum dot adhesive layer and the first photoresist layer to obtain a first photolithography structure.

The first photoresist layer 410 and the first quantum dot adhesive layer 310 were sequentially exposed (ultraviolet irradiation) and developed by a first mask plate to make at least one sub-pixel region bare, and at least one sub-pixel region be still filled with a part of the first quantum dot adhesive layer 310. The remaining first quantum dot adhesive layer 310 and the first photoresist layer 410 were cured to form a first photolithography structure, as shown in FIGS. 4 and 5.

Materials of the second quantum dot adhesive layer 320 were prepared, including: 30% by mass of CdSe quantum dots, 40% by mass of acrylic resin monomer, 20% by mass of epoxy resin monomer, 2% by mass of thermal initiator and 8% by mass of the auxiliary agent, stirred to mix evenly as standby.

Figure 6:
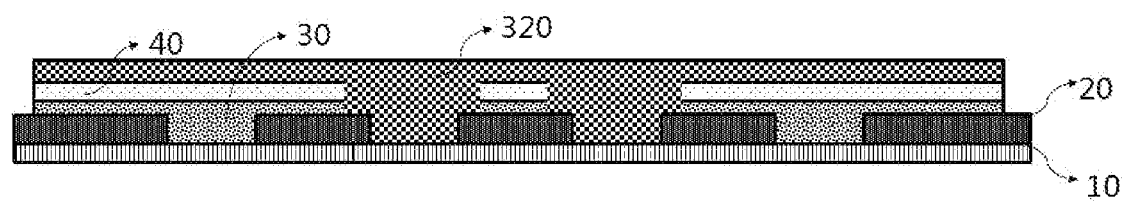
FIG. 6 shows a sectional view of the workpiece after forming a second quantum dot adhesive layer covering the first photolithography structure on the substrate layer shown in FIG. 5.
Figure 7:
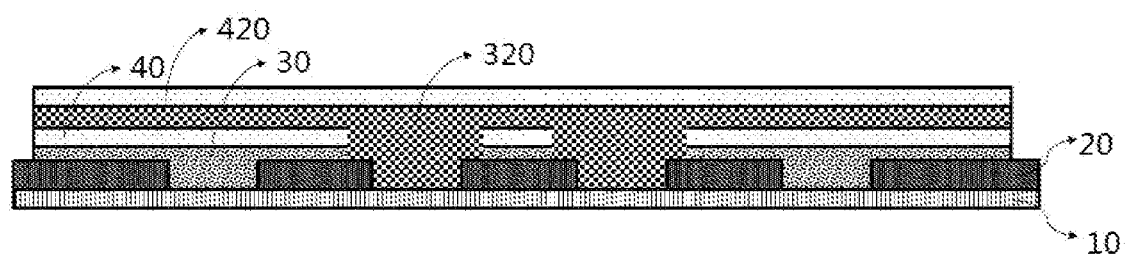
FIG. 7 shows a sectional view of the workpiece after forming a second photoresist layer covering the second quantum dot adhesive layer shown in FIG. 6.

The materials of the second quantum dot adhesive layer 320 were provided on the substrate layer 10, and a second quantum dot adhesive layer 320 with 5 μm thickness covering the first photolithography was formed, so that a part of the second quantum dot adhesive layer 320 was filled in the bare sub-pixel regions. A second photoresist layer 420 of about 2 μm thickness was formed on the surface of the second quantum dot adhesive layer 320 using a positive photoresist (linear phenolic resin photoresist), as shown in FIGS. 6 and 7.

Figure 8:
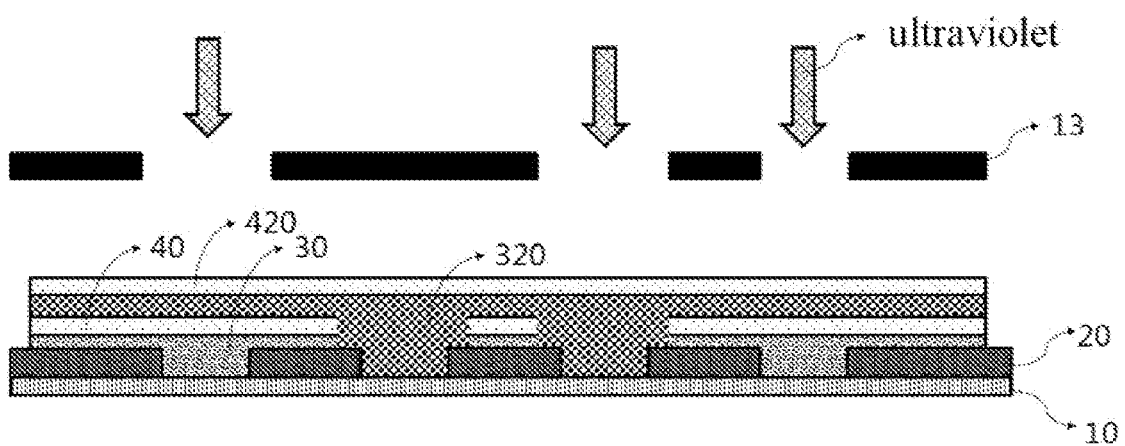
FIG. 8 shows a sectional view of the workpiece after exposing the second photoresist layer and the second quantum dot adhesive layer shown in FIG. 7 by using a second mask plate.
Figure 9:
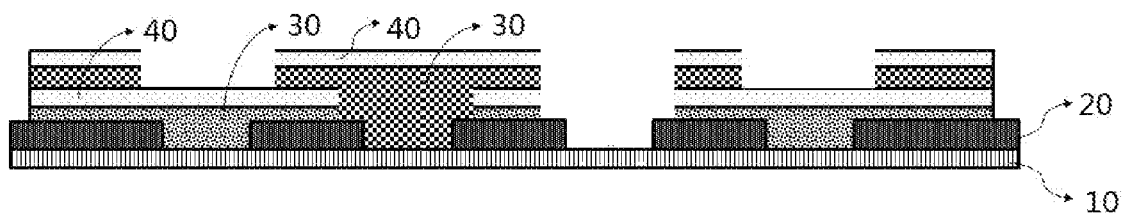
FIG. 9 shows a sectional view of the workpiece after developing the second photoresist layer and the second quantum dot adhesive layer shown in FIG. 8 and curing the remaining second quantum dot adhesive layer and the second photoresist layer to obtain a second photolithography structure.

The second photoresist layer 420 and the second quantum dot adhesive layer 320 were sequentially exposed (ultraviolet irradiation) and developed by a second mask plate to make at least one sub-pixel region bare, and at least one sub-pixel region be still filled by a part of the second quantum dot adhesive layer 320. The remaining second quantum dot adhesive layer 320 and the second photoresist layer 420 were cured to form a second photolithography structure, as shown in FIGS. 8 and 9.

First planarization layers 50 were formed on the substrate layer 10, and a second planarization layer 60 was formed to cover the surface of the patterned quantum dot structures 30, the cured photoresist layers 40 and the first planarization layers 50, as shown in FIGS. 10 and 11.

Example 2

Figure 12:
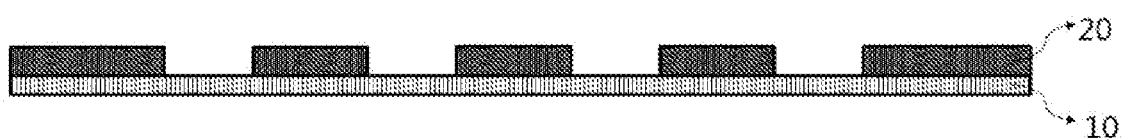
FIG. 12 shows a sectional view of the workpiece after forming a plurality of pixel isolation structures on a first surface of the substrate layer in a preparation method of another light conversion device according to the present disclosure.

The preparation method of the light conversion device provided in this embodiment was shown in FIGS. 12 to 21, including the following steps:

A plurality of pixel isolation structures 20 were formed on the first surface of the substrate layer 10, and a plurality of sub-pixel regions separated from each other were formed between the pixel isolation structures 20, as shown in FIG. 12.

Materials of the first quantum dot adhesive layer 310 were prepared, including: 30% a by mass of CdSe quantum dots, 40% by mass of acrylic resin monomer, 20% by mass of epoxy resin monomer, 2% by mass of thermal initiator and 8% by mass of the auxiliary agent, stirred to mix evenly as standby.

Figure 13:
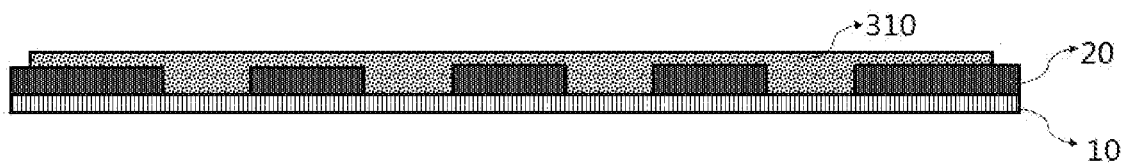
FIG. 13 shows a sectional view of the workpiece after forming a first quantum dot adhesive layer on the substrate layer shown in FIG. 12.
Figure 14:
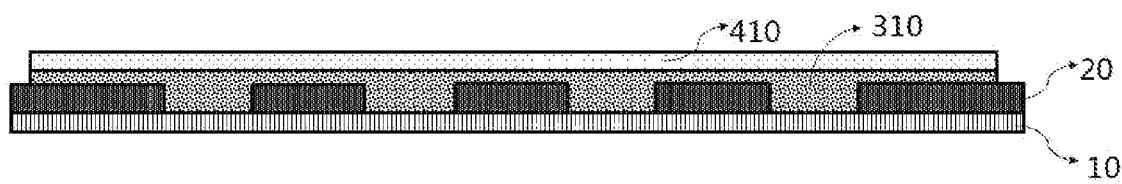
FIG. 14 shows a sectional view of the workpiece after forming a first photoresist layer on the first quantum dot adhesive layer shown in FIG. 13.

The materials of the first quantum dot adhesive layer 310 were provided on the substrate layer 10 to form a first quantum dot adhesive layer 310 having a thickness of about 5 μm, so that a part of the first quantum dot adhesive layer 310 was filled in each sub-pixel region. A first photoresist layer 410 of about 2 μm thickness was formed on the surface of the first quantum dot adhesive layer 310, using a negative photoresist (acrylic resin photoresist) as shown in FIGS. 13 and 14.

Figure 15:
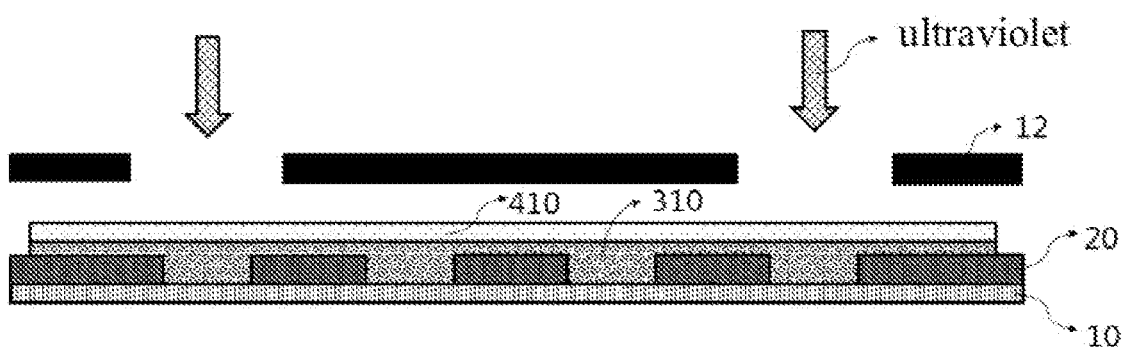
FIG. 15 shows a sectional view of the workpiece after exposing the first photoresist layer and the first quantum dot adhesive layer by using a first mask plate.
Figure 16:
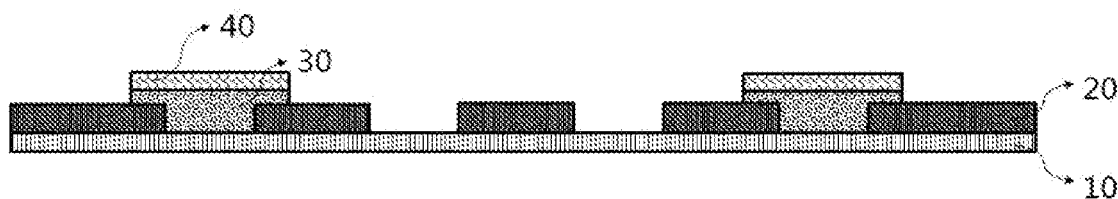
FIG. 16 shows a sectional view of the workpiece after developing the first photoresist layer and the first quantum dot adhesive layer shown in FIG. 15 and curing the remaining first quantum dot adhesive layer and the first photoresist layer to obtain a first photolithography structure.

The first photoresist layer 410 and the first quantum dot adhesive layer 310 were sequentially exposed (ultraviolet irradiation) and developed by a first mask plate to make at least one sub-pixel region bare, and at least one sub-pixel region be still filled by a part of the first quantum dot adhesive layer 310. The remaining first quantum dot adhesive layer 310 and the first photoresist layer 410 were cured to form a first photolithography structure, as shown in FIGS. 15 and 16.

Materials of the second quantum dot adhesive layer 320 were prepared, including: 30% by mass of CdSe quantum dots, 40% by mass of acrylic resin monomer, 20% by mass of epoxy resin monomer, 2% by mass of thermal initiator and 8% by mass of the auxiliary agent, stirred to mix evenly as standby.

Figure 17:
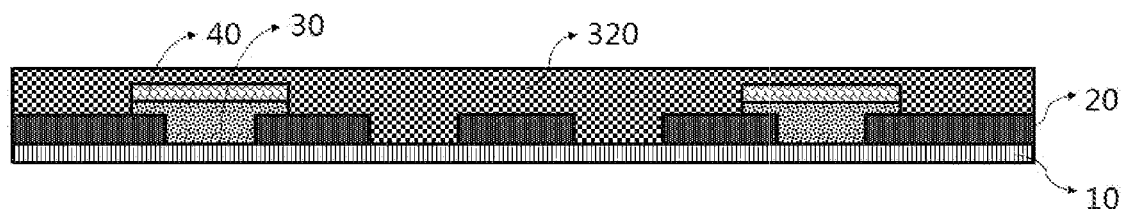
FIG. 17 shows a sectional view of the workpiece after forming a second quantum dot adhesive layer coveting the first photolithography structure on the substrate layer shown in FIG. 16.
Figure 18:
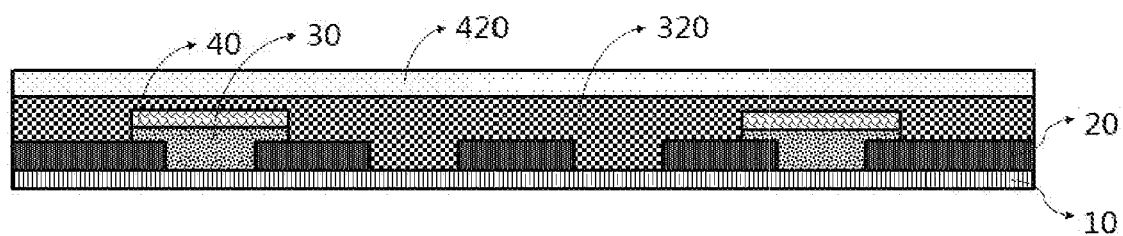
FIG. 18 shows a sectional view of the workpiece after forming a second photoresist layer covering the second quantum dot adhesive layer shown in FIG. 17.

The materials of the second quantum dot adhesive layer 320 were disposed on the substrate layer 10, the second quantum dot adhesive layer 320 having a thickness of about 5 μm covering the first photolithography structure was formed, to make a part of the second quantum dot adhesive layer 320 fill in the bare sub-pixel region, a second photoresist layer 420 of about 2 μm thickness was formed on the surface of the second quantum dot adhesive layer 320 using a negative photoresist (acrylic resin photoresist), as shown in FIGS. 17 and 18.

Figure 19:
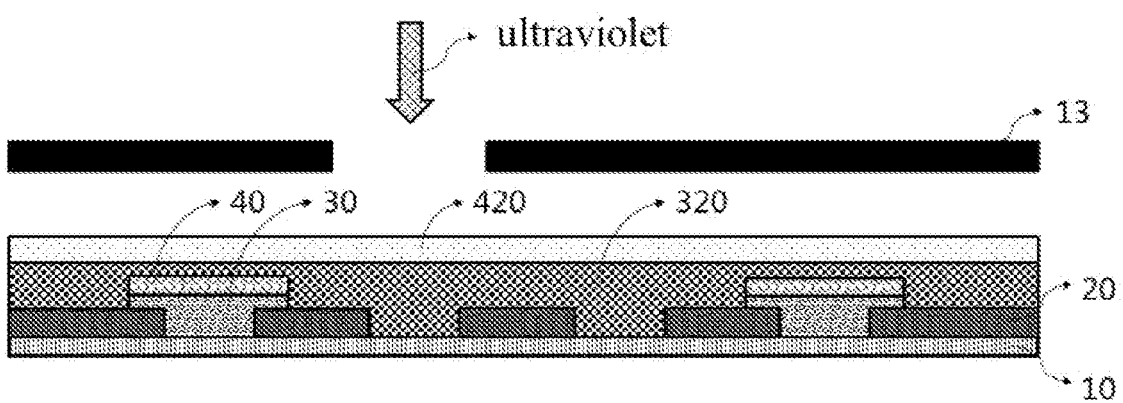
FIG. 19 shows a sectional view of the workpiece after exposing the second photoresist layer and the second quantum dot adhesive layer shown in FIG. 18 by using a second mask plate.
Figure 20:
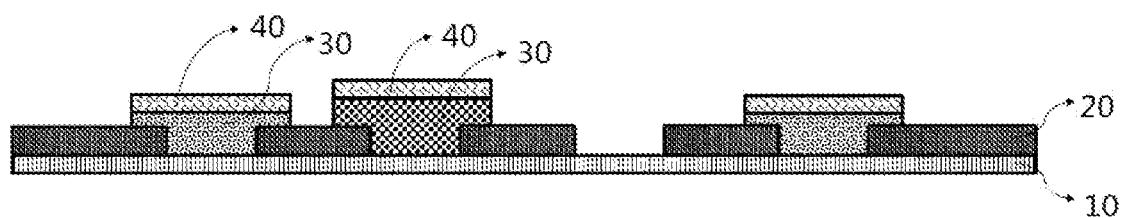
FIG. 20 shows a sectional view of the workpiece after developing the second photoresist layer and the second quantum dot adhesive layer shown in FIG. 19 and curing the remaining second quantum dot adhesive layer and the second photoresist layer to obtain a second photolithography structure.

The second photoresist layer 420 and the second quantum dot adhesive layer 320 were sequentially exposed (ultraviolet irradiation) and developed by the second mask plate to make at least one sub-pixel region bare, and at least one sub-pixel region be still filled by a part of the second quantum dot adhesive layer 320. The remaining second quantum dot adhesive layer 320 and the second photoresist layer 420 were cured to form a second photolithography structure, as shown in FIGS. 19 and 20.

A first planarization layer 50 was formed on the substrate layer 10 to cover the patterned quantum dot structures 30 and the cured photoresist layers 40, as shown in FIG. 21.

The current density-voltage curve of the light conversion device was measured by Keithley2400, and the brightness of the light conversion device was measured using the integrating ball (FOIS-1) in conjugation with the spectrometers from Ocean optics (QE-PRO). The external quantum efficiency of the light conversion device was calculated based on the measured current density and the brightness. The external quantum efficiency was characterized by the ratio between the number of photons emitted in the observation direction and the number of electron injected into the device, which was an important parameter of characterization of the emission efficiency of the light conversion device. The higher the external quantum efficiency, the higher the emission efficiency of the device.

The external quantum efficiency test was mainly divided into two parts: the first part, the Keithley2400 digital source table and the probe seat were combined to measure the voltage (V) and current (I) signals of the device, and further derive the voltage (V)-current density (J) graph during working and the number of electrons passing through the device within unit time; the second part, integrating sphere, fiber and spectrometer (QE65000 or QEPRO), were combined to measure spectral data in front of the device, including fluorescent peaks, full width at half maximum and number of emitting photons. The data of the above two parts could be combined to calculate the external quantum efficiency (EQE) of the device according to the formula. The light conversion devices prepared in Examples 1 and 2 were respectively detected, and the detection results are recorded in Table 1.

TABLE 1

| Example | EQE |
| --- | --- |
| 1 | 45% |
| 2 | 30% |

From the above description, it could be seen that the aforesaid Examples can achieve effects as follows:
1. The above-described preparation process of the present disclosure could function as protecting the patterned quantum dot structure, so that the patterned quantum dot structure has a high quantum dot concentration, improving the light conversion efficiency of the light conversion device.
2. Compared to the quantum dot photoresist used in the prior art, the present disclosure can obtain the above patterned quantum dot structure by only using the ordinary quantum dot adhesive, without the need of special photoresist, so that the high blue light absorption rate of the light conversion devices can be achieved by the high concentration of quantum dot adhesive, and the costs can be reduced.
3. Unlike the process of using the quantum dot photoresist inducting the photoinitiator in the prior art, the quantum dot adhesive in the sub-pixel region in the process of the present disclosure is free of exposure, thereby without the quenching caused by the photoinitiator. Even if the quantum dot adhesive in the sub-pixel region is exposed, the problem of quenching of quantum dot caused by the photoinitiator can be greatly reduced due to the absence of the photoinitiator.
4. In the development process of the preparation method of the present disclosure, all of what the developer contacts with were the non-target pixel regions, and the quantum dots in the target pixel regions could be not quenched because of the protection of the cured photoresist layer, which effectively guarantees that the prepared light conversion device can have high light emitting efficiency.

The foregoing embodiments are only preferred embodiments of the present disclosure, and cannot be used to limit the scope of protection of the present disclosure. Any insubstantial changes and substitutions made by those skilled in the art on the basis of the present disclosure belong to the protection scope of the present disclosure.

What is claimed is:

1. A preparation method of a light conversion device, comprising:
    S1, disposing a plurality of pixel isolation structures on a first surface of a substrate layer, a plurality of sub-pixel regions isolated from each other being formed between the pixel isolation structures;
    S2, performing a photolithography process n times on the substrate layer sequentially wherein each of the photolithography processes comprises:
    forming a quantum dot adhesive layer and a photoresist layer on the substrate layer in sequence, the photoresist layer being located on the quantum dot adhesive layer far away from substrate layer, and a part of the quantum dot adhesive layer filling in bare sub-pixel regions:
    exposing and developing the photoresist layer, and exposing at least one sub-pixel region;
    in each of the photolithography processes, a number of bare sub-pixel regions after a mth time photolithography process being larger than a number of bare sub-pixel regions after (m+1)th time photolithography process, the bare sub-pixel regions after the mth time photolithography process being filled with a part of the quantum dot adhesive layer formed in the (m+1) time photolithography process, and orthographic projections of patterned quantum dot structures obtained in each of the photolithography processes being not overlapped in the sub-pixel regions,
    curing the quantum dot adhesive layers which are remaining and the photoresist layers which are remaining to obtain the patterned quantum dot structures and cured photoresist layers, wherein n>m≥1, and n and m are all positive integers.

2. The preparation method according to claim 1, wherein the S2 comprises:
    S21, a first photolithography process comprising: forming a first quantum dot adhesive layer and a first photoresist layer in sequence on the substrate layer, with a part of the first quantum dot adhesive filling in each sub-pixel region and a surface of the first quantum dot adhesive layer being covered with the first photoresist layer, exposing and developing the first photoresist layer and the first quantum dot adhesive layer in sequence by using a first mask plate so as to expose at least one sub-pixel region, and the at least one sub-pixel region to be filled with a part of the first quantum dot adhesive layer, and curing the first quantum dot adhesive layer which is remaining and the first photoresist layer to form a first patterned quantum dot structure and a first cured photoresist layer, the first patterned quantum dot structure and the first cured photoresist layer forming a first photolithography structure;

S22, a second photolithography process comprising: forming a second quantum dot adhesive layer covering the first photolithography structure on the substrate layer, forming a second photoresist layer covering the second quantum dot adhesive layer, with a part of the second quantum dot adhesive layer filling in the bare sub-pixel regions, and a surface of the second quantum dot adhesive layer being covered with the second photoresist layer, exposing and developing the second photoresist layer and the second quantum dot adhesive layer in sequence by using a second mask plate so as to expose at least one sub-pixel region, and the at least one sub-pixel region to be filled with a part of the second quantum dot adhesive layer, and curing the second quantum dot adhesive layer which is remaining and the second photoresist layer to form a second patterned quantum dot structure and a second cured photoresist layer, the second patterned quantum dot structure and the second cured photoresist layer forming a second photolithography structure.

3. The preparation method according to claim 2, wherein the S2 further comprises:

S23, repeating the photolithography process of the S22 at least once to form each of the patterned quantum dot structures and each of the cured photoresist layers.

4. The preparation method according to claim 2, wherein quantum dot materials of the quantum dot adhesive layer in each of the photolithography processes are the same or different.

5. The preparation method according to claim 4, wherein the quantum dot materials are selected from red quantum dots, green quantum dots or blue quantum dots.

6. The preparation method according to claim 2, wherein the photoresist layer in each of the photolithography processes is formed of the same or different photoresist.

7. The preparation method according to claim 6, wherein the photoresist layer is formed of a positive photoresist or negative photoresist.

8. The preparation method according to claim 1, wherein, the quantum dot adhesive layer comprises an adhesive and quantum dot materials dispersed in the adhesive, and in the S2, the step of exposing at least one sub-pixel region comprises:

the adhesive being the same as the material forming the photoresist layer, and in the step of exposing and developing the photoresist layer, treating the quantum dot adhesive layer with a developer to remove a part of the quantum dot adhesive layer having a bare surface; or the adhesive being different from the material forming the photoresist layer, and after the step of exposing and developing the photoresist layer, a part of the surface of the quantum dot adhesive layer being exposed, and etching the quantum dot adhesive layer to remove a part of the quantum dot adhesive layer having a bare surface.

9. The preparation method according to claim 1, wherein, the step of exposing and developing the photoresist layer comprises: exposing and developing the photoresist layer of a specific region to remove the photoresist layer of the specific region, the specific region comprising a region right above the at least one sub-pixel region and at least part of a region right above the pixel isolation structure which defines the at least one sub-pixel region, and the at least part of the region right above the pixel isolation structure being a region close to the sub-pixel region in the specific region.

10. The preparation method according to claim 1, wherein, after the S2, the preparation method further comprises S3: forming a planarization layer on the substrate layer to cover the patterned quantum dot structures and the cured photoresist layers.

11. The preparation method according to claim 1, wherein, in the S2, the step of forming the quantum dot adhesive layer and the photoresist layer on the substrate layer in sequence comprises: disposing a quantum dot adhesive and a photoresist on the substrate layer in sequence, and pre-curing to form the quantum dot adhesive layer and the photoresist layer.

12. A light conversion device, comprising a substrate layer and a plurality of pixel isolation structures disposed on a first surface of the substrate layer to separate a plurality of sub-pixel regions from each other, the plurality of pixel isolation structures are opaque, wherein, the light conversion device further comprises:

a plurality of patterned quantum dot structures disposed on a surface of the substrate layer with the pixel isolation structures, for emitting light with multiple colors under excitation of a light source, wherein, each of the patterned quantum dot structures consists of a light conversion structure and a non-light conversion structure, the light conversion structure is disposed in at least one of the plurality of sub-pixel regions, and orthographic projections of the different types of non-light conversion structures corresponding to the different types of patterned quantum dot structures on the pixel isolation structures are at least partially overlapped;

cured photoresist layers, covering a surface of each of the patterned quantum dot structures away from the substrate layer, the cured photoresist layers being disposed on a surface of the light conversion structure in different patterned quantum dot structures, and the cured photoresist layers being disposed between the different types of non-light conversion structures corresponding to the different patterned quantum dot structures.

13. The light conversion device according to claim 12, wherein quantum dot materials in each of the patterned quantum dot structures are selected from red quantum dots, green quantum dots or blue quantum dots.

14. The light conversion device according to claim 12, wherein the cured photoresist layers are formed by curing a positive photoresist or negative photoresist.

15. The light conversion device according to claim 12, wherein, the light conversion device further comprises a planarization layer, and the planarization layer covers the patterned quantum dot structures and the cured photoresist layers.

16. A display device, comprising a light conversion device, wherein the light conversion device is the light conversion device according to claim 12.

17. The display device according to claim 16, wherein, the light conversion device further comprises a planarization layer, and the planarization layer covers the patterned quantum dot structures and the cured photoresist layers.

* * * * *